US007501303B2

(12) United States Patent
Unlu et al.

(10) Patent No.: US 7,501,303 B2
(45) Date of Patent: Mar. 10, 2009

(54) REFLECTIVE LAYER BURIED IN SILICON AND METHOD OF FABRICATION

(75) Inventors: M. Selim Unlu, Jamaica Plain, MA (US); Matthew K. Emsley, Wilmington, DE (US)

(73) Assignee: The Trustees of Boston University, Boston, MA (US)

( * ) Notice: Subject to any disclaimer, the term of this patent is extended or adjusted under 35 U.S.C. 154(b) by 0 days.

(21) Appl. No.: 10/790,403

(22) Filed: Mar. 1, 2004

(65) Prior Publication Data

US 2004/0169245 A1 Sep. 2, 2004

Related U.S. Application Data

(63) Continuation of application No. 10/009,386, filed on Nov. 5, 2001, now abandoned.

(51) Int. Cl.
*H01L 33/00* (2006.01)
*H01L 21/00* (2006.01)
(52) U.S. Cl. ................. 438/57; 438/459; 438/977; 257/E33.069
(58) Field of Classification Search ............... 438/460, 438/455, 977, 48, 57; 257/E33.069; 359/584
See application file for complete search history.

(56) References Cited

U.S. PATENT DOCUMENTS

| | | | |
|---|---|---|---|
| 4,670,765 A | 6/1987 | Nakamura et al. | 357/30 |
| 5,020,066 A | 5/1991 | Iga et al. | 372/45 |
| 5,227,648 A | 7/1993 | Woo | 257/185 |
| 5,315,128 A | 5/1994 | Hunt et al. | 257/16 |
| 5,374,564 A | 12/1994 | Bruel | 437/24 |
| 5,376,215 A | 12/1994 | Ohta et al. | 156/345 |
| 5,389,797 A | 2/1995 | Bryan et al. | 257/21 |
| 5,455,421 A | 10/1995 | Spears | 250/338.4 |
| 5,498,863 A | 3/1996 | Miller | 250/214.1 |
| 5,525,828 A | 6/1996 | Bassous et al. | 257/457 |
| 5,559,912 A | 9/1996 | Agahi et al. | 385/42 |

(Continued)

FOREIGN PATENT DOCUMENTS

WO    WO 96/39719    12/1996

(Continued)

OTHER PUBLICATIONS

Ishikawa et al., "Epitaxy-ready Si/SiO$_2$ Bragg Reflectors by Multiple Separation-by-Implanted Oxygen", Appl. Phys. Letters, vol. 69, No. 25 Dec. 16, 1996.

(Continued)

*Primary Examiner*—M. Wilczewski
(74) *Attorney, Agent, or Firm*—Weingarten, Schurgin, Gagnebin & Lebovici LLP

(57) ABSTRACT

A silicon wafer having a distributed Bragg reflector buried within it. The buried reflector provides a high efficiency, readily and accurately manufactured reflector with a body of silicon. A photodetector using the buried layer to form a resonant cavity enhancement of the silicon's basic quantum efficiencies and selectivity is provided. The DBR is created by bonding of two or more substrates together at a silicon oxide interface or an oxide-oxide interface. In the former, an hydrogen implant is used to cleave silicon just above the bond line. In the latter, the bonding is at the oxide layers.

14 Claims, 16 Drawing Sheets

U.S. PATENT DOCUMENTS

| | | | | |
|---|---|---|---|---|
| 5,671,914 | A | 9/1997 | Kalkhoran et al. | 257/77 |
| 5,710,057 | A | 1/1998 | Kenney | 437/62 |
| 5,726,440 | A | 3/1998 | Kalkhoran et al. | 250/214.1 |
| 5,757,986 | A | 5/1998 | Crampton et al. | 385/2 |
| 5,767,507 | A | 6/1998 | Unlu et al. | 250/225 |
| 5,770,511 | A | 6/1998 | Matsumoto et al. | 438/406 |
| 5,793,060 | A | 8/1998 | Morikawa | 257/85 |
| 5,837,561 | A | 11/1998 | Kish, Jr. et al. | 438/47 |
| 6,323,108 | B1* | 11/2001 | Kub et al. | 438/458 |
| 6,335,231 | B1* | 1/2002 | Yamazaki et al. | 438/151 |
| 6,368,938 | B1* | 4/2002 | Usenko | 438/407 |
| 6,566,233 | B2* | 5/2003 | Yokokawa et al. | 438/455 |
| 6,607,969 | B1* | 8/2003 | Kub et al. | 438/458 |
| 6,641,662 | B2* | 11/2003 | Radojevic et al. | 117/2 |
| 2001/0032977 | A1* | 10/2001 | Abe et al. | 257/15 |
| 2004/0169245 | A1* | 9/2004 | Unlu et al. | 257/432 |
| 2004/0224482 | A1* | 11/2004 | Kub et al. | 438/458 |
| 2006/0014330 | A1* | 1/2006 | Ichikawa et al. | 438/149 |
| 2006/0024915 | A1* | 2/2006 | Kobayashi | 438/455 |

FOREIGN PATENT DOCUMENTS

WO    WO 00/67891 A2 * 11/2000

OTHER PUBLICATIONS

Sinnis et al. "Silicon-based Resonant-cavity-enhanced Photodiode with a Buried SiO$_2$ Reflector", Appl. Phys. Letters, vol. 74, No. 9, Mar. 1, 1999.

Schow et al., "Design and Implementation of High-speed Planar Si Photodiodes Fabricated on SOI Substrates", IEEE Journal of Quantum Electronics, vol. 35, No. 10, Oct. 1999.

Schaub et al., "Resonant-cavity-enhanced High-speed Si Photodiode Grown by Epitaxial Lateral Overgrowth", IEEE Photonics Technology Letters, vol. 11, No. 12, Dec. 12, 1999.

Jalali et al., "Advances in Silicon-on-Insulator Optoelectronics", IEEE Journal of Selected Topics in Quantum Elelctonics, col. 4, No. 6, Nov./Dec. 1998.

Fukatsu et al., "Spectral Modulation of Luminescence of Strained $Si_{1-x}Ge_x$/Si Quantum Wells in a Vertical Cavity with air/Si and Si/SiO$_2$ Interface Mirrors", Appl. Phys. Letters, vol. 65, No. 24, Dec. 12, 1994.

Yonehara et al., "Epitaxial Layer Transfer by Bond and Etch Back of Porous Si", Appl Phys. Letters, vol. 64, No. 16, Apr. 18, 1994.

Tan et al., "Modeling and Performance of Wafer-Fused Resonant-Cavity Enhanced Photodetectors", IEEE Journal of Quantum Electronics, vol. 31, No. 10, Oct. 10, 1995.

Bean et al., "High-Speed Polysilicon Resonant-Cavity Photodiode with SiO$_2$-Si Bragg Reflectors", IEEE Photonics Technology Letters, col. 9, No. 6, Jun. 1997.

Diaz et al., "Si/SiO$_2$ Resonant Cavity Photodetector", Appl. Phys. Letters, vol. 69, No. 19, Nov. 4, 1996.

Murtaza et al., "Short-Wavelength, High-Speed, Si-Based Resonant-Cavity Photodetector", IEEE Photonics Technology Letters, vol. 8, No. 7, Jul. 1996.

Sato et al., "High-Quality Epitaxial Layer Transfer (ELTRAN) by Bond And Etch-Back of Porous Si", Proceedings of 1995 IEEE International SOI Conference, Oct. 1995.

Alles et al., "Advanced Manufacturing of SIMOX for Low Power Electronics", Solid State Electronics, vol. 39, No. 4, pp. 499-504, 1996.

Wada et al., "A New Approach of Photonic Bandgap Formation-Wafer Bonding and Delamination Technique", Extended Abstracts of the 1998 International Conference on Solid State Devices and Materials, pp. 382-383 1998.

Unlu et al., "Resonant Cavity Enhanced Photonic Devices", Journal Appl. Phys. vol. 78, No. 2, Jul. 15, 1995.

* cited by examiner

REFLECTIVE LAYER BURIED IN SILICON AND METHOD OF FABRICATION

CROSS REFERENCE TO RELATED APPLICATIONS

This application is a continuation of U.S. application Ser. No. 10/009,386 filed Nov. 5, 2001 now abandoned entitled, REFLECTIVE LAYER BURIED IN SILICON AND METHOD OF FABRICATION, the whole of which is hereby incorporated by reference herein.

STATEMENT REGARDING FEDERALLY SPONSORED RESEARCH OR DEVELOPMENT

The present invention was funded in whole or in part by Government Support under Contract Number DAAD17-99-2-0070 awarded by the Army Research Laboratory. The Government has certain rights in the invention.

FIELD AND BACKGROUND OF THE INVENTION

The advent of high speed communications links using chains of photodetectors and emitters has increased the pressure to find a low cost, quantum efficient detector with high speed capability. Silicon has been the material of choice for such detectors. The need for sensitivity implies greater silicon thickness but that is met with increased noise and reduced bandwidth.

The present invention has the goal of providing a buried reflector in a silicon wafer. The buried layer has particular advantage in providing a more cost effective and efficient photodetector assembly using silicon as the light detecting material. Silicon is advantageous because its micromechanical processing is well established and understood, and thus efficient. In the construction of photodetectors of silicon it is normally desired to overcome the relatively low photon absorption of silicon through the use two reflecting surfaces separated by the silicon to provide a Fabry-Perot cavity and enhanced sensitivity and selectivity. The realization of such a cavity structure has been hampered by the fact that in conventional silicon processing, the cavity dimensions, which define selectivity and wavelength, have been hard to control.

SUMMARY OF THE INVENTION

The present invention provides a reflective layer buried in silicon. The buried layer is provided as a Distributed Bragg Reflector (DBR). This reflective layer has particular advantage for use in a silicon based photodetector using resonant cavity enhancement of the silicon's basic quantum efficiencies and selectivity using the buried, distributed Bragg reflector (DBR) formed in the silicon cavity.

The DBR is created by bonding of two or more substrates together at a silicon oxide interface or oxide interface. In the former, an hydrogen implant is used to cleave silicon just above the bond line. In the latter, the bonding is at the oxide layers. In the former, after the steps are repeated to achieve a desired number of alternating silicon and oxide layers, a conducting layer is implanted, an epitaxial layer is grown and then another conducting implant. Finally metalizations are applied to and through the surface and a window through the oxide provided for the admittance of light.

In the latter case, two oxide topped wafers are joined, repeatedly to get the desired number of alternating layers. The first bonding has one layer given an implant of a dopant to impart conductivity.

DESCRIPTION OF THE DRAWING

These and other features of the invention are more fully set forth below and in the accompanying drawing of which.

DETAILED DESCRIPTION

The present invention provides a distributed Bragg reflector (DBR) as a reflective layer in a silicon wafer. The reflective layer is shown in an application for use as a photodetector assembly. The reflective layer provides for an enhanced Fabry-Perot, resonant cavity response to incident light. The buried layer comprises alternating silicon and silicon dioxide layers which form the distributed Bragg reflector (DBR).

Figure 1:
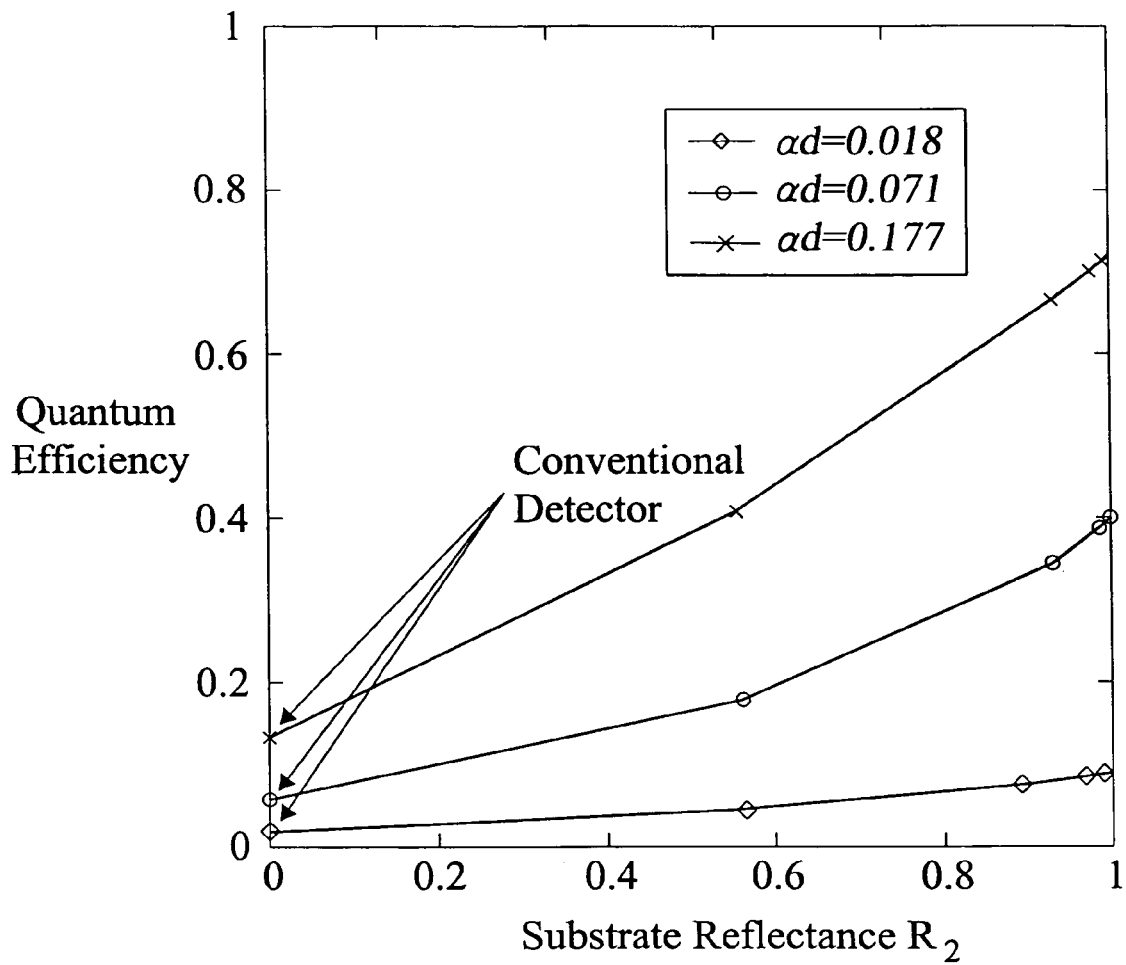
FIG. 1 is a graph illustrating the performance enhancement of a photodetector using the present invention.
Figure 2:
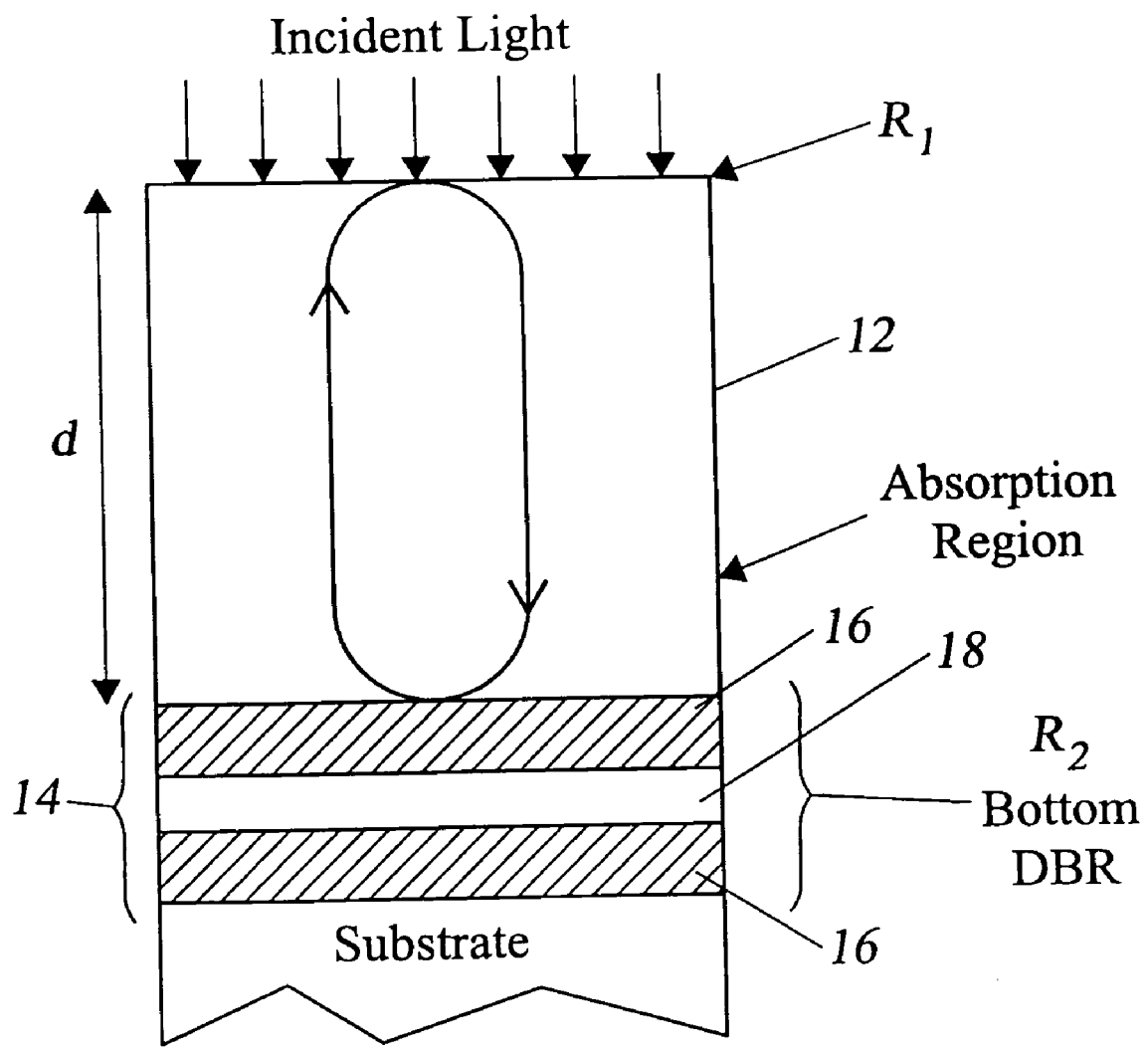
FIG. 2 is a diagram of a photodetector structure using a buried layer according to the invention.

The invention provides a buried DBR reflector which in its application to a photodetector acts to improve the quantum efficiency of a silicon light detector relative to a detector without the buried reflector. FIG. 1 illustrates graphically the improvement in efficiency as a function of the buried reflectance for silicon of different $\alpha d$ (absorption coefficient, silicon depth product) values showing a great improvement over regular or conventional detectors without the buried layer. FIG. 2 illustrates the basic structure of the invention in a photodetector in which a silicon body 12 has a buried DBR layer 14 comprising alternating silicon dioxide 16 and silicon layers 18 spaced to provide a Fabry-Perot cavity in the silicon 12. To create a photodetector from the buried DBR 14 a top reflective surface is formed with the interface of the silicon 12 and the air environment.

Figure 3:
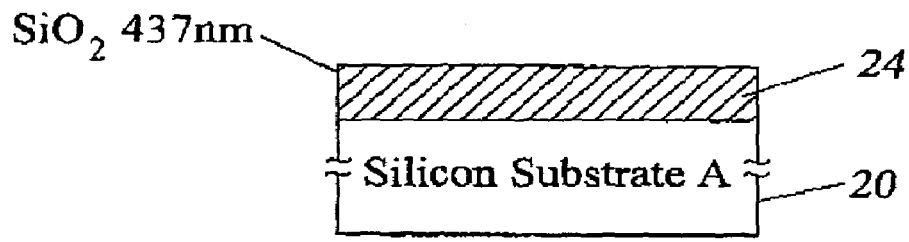
FIG. 3-24 illustrate one method of forming the buried layer and its application to a photodetector according to the present invention.
Figure 4A:
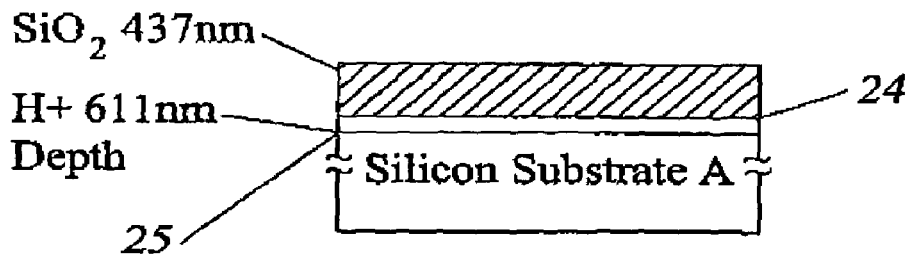
Figure 4B:
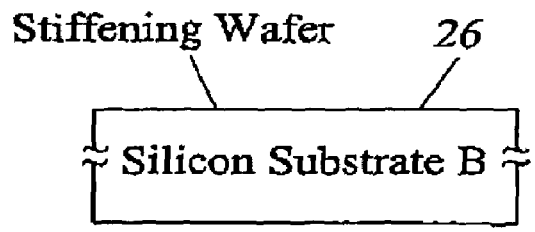
Figure 5:
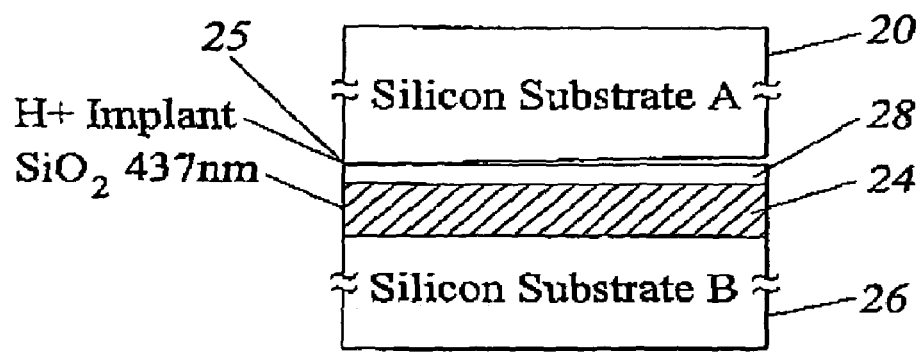
Figure 6:
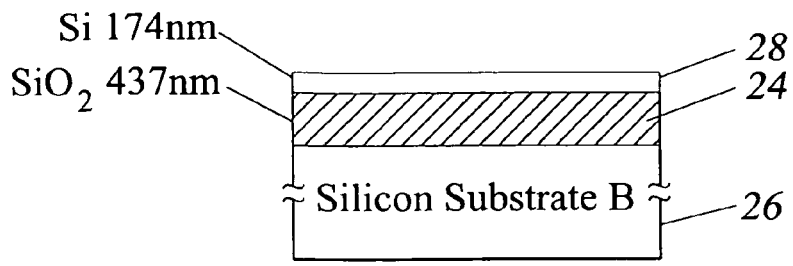

A preferred method for the fabrication of the buried layer 14 of FIG. 2 is illustrated with respect to FIGS. 3-13. The photodetector application is then illustrated in FIGS. 11-24. In FIG. 3 a wafer of silicon 20 has an oxide layer 22 thereon. Dimensions are given in the figures for purposes of an example for a photodetector selected to respond selectively to light distributed around 850 nm (+/− nearly 100 nm), but the invention is not limited to any particular wavelength. In this case the silicon dioxide is 437 nm in depth. Hydrogen atoms are implanted through the oxide to form a thin layer 25 at an exemplary depth of 611 nm with a dosage of, for example only, $2\times10^{16}$ cm$^{-2}$ to $1\times10^{17}$ cm$^{-2}$ and thus and thus are placed in the silicon below the oxide as shown in FIG. 4a. A second silicon body 26 is provided in FIG. 4b and the oxide layer 22 is thermally bonded onto the top of this layer 26. The thermal bonding, typically at 600 degrees C., cleaves the boundary between the hydrogen and no hydrogen containing silicon, leaving a 174 nm silicon layer 28 on top of the oxide 24 as shown in FIG. 5. Final bonding at 1000 degrees C. is then performed. The top silicon layer 28 is mechanically polished to achieve the result of FIG. 6.

Figure 7:
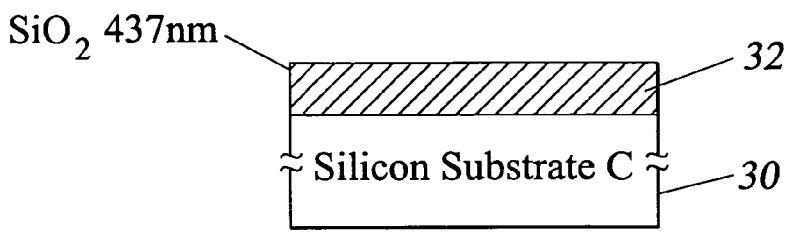
Figure 8A:
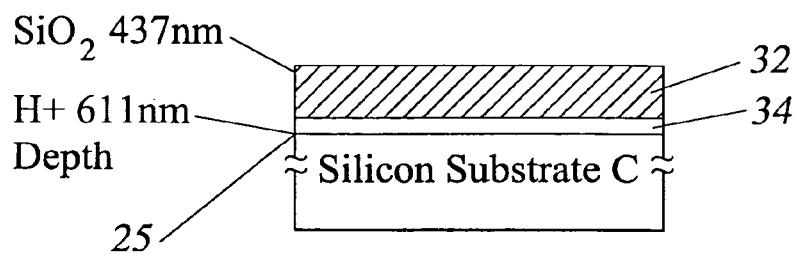
Figure 8B:
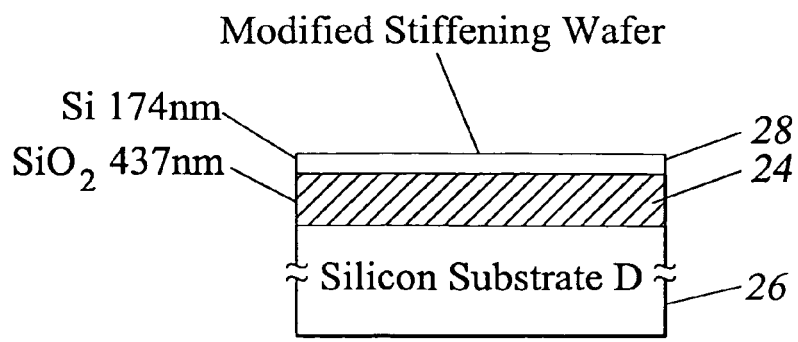
Figure 9:
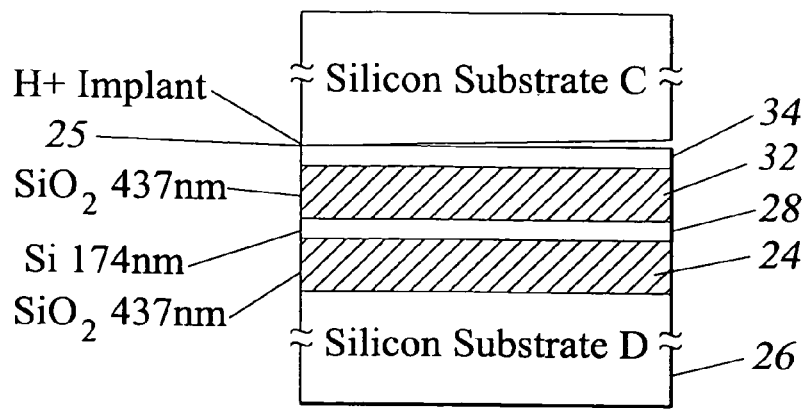
Figure 10:
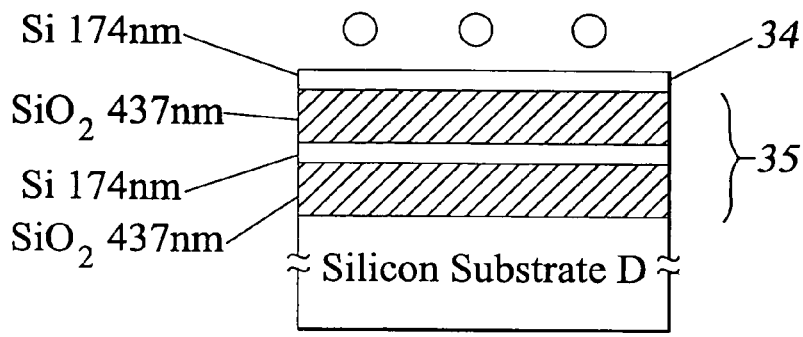
Figure 11:
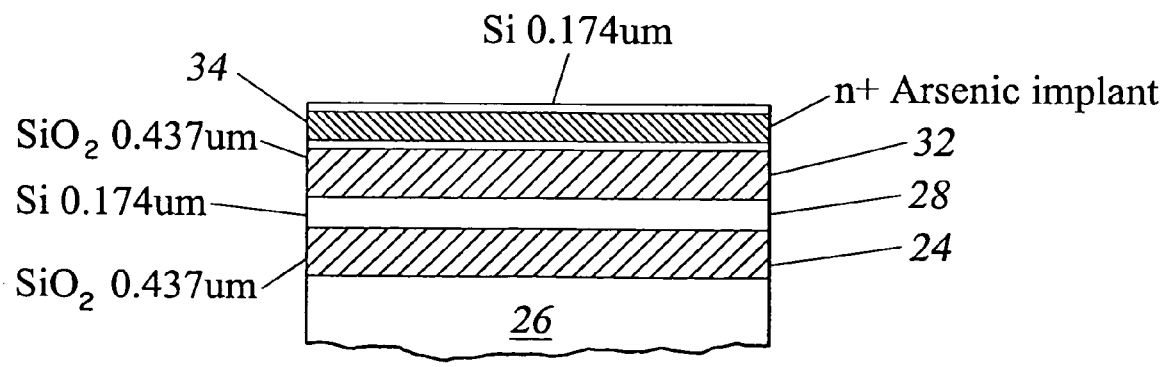
Figure 12:
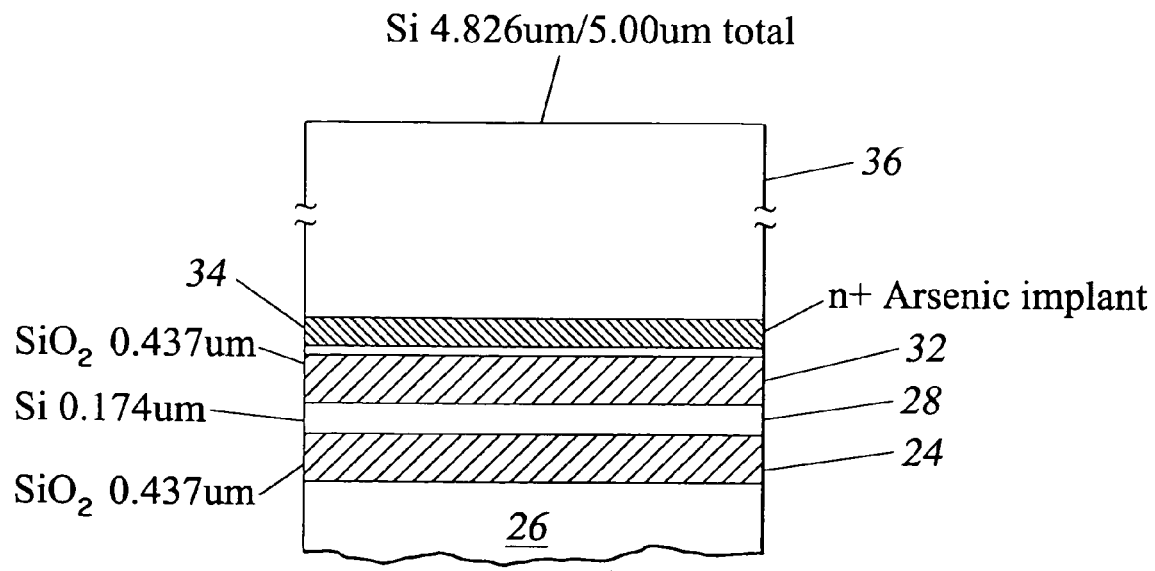
Figure 13:
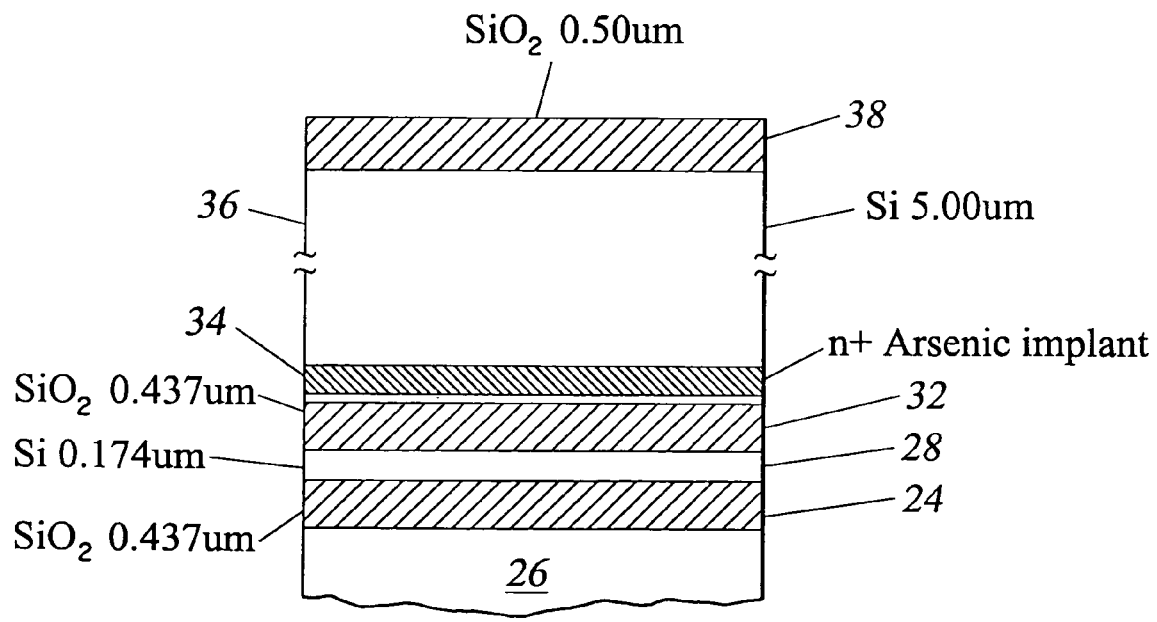

Additional layers are created by continuing the above process until the desired layer structure is achieved. FIG. 7 illustrates the provision of a further body of silicon 30 having an oxide layer 32 as shown in FIG. 3. FIG. 8A illustrates the addition of an hydrogen layer 34 as above which is then bonded to the layer of FIG. 6, reproduced as FIG. 8B to achieve the bonded and cleaved wafer of FIG. 9. For the exemplary case of an 850 nm detector, a layering of hydrogenated silicon and oxide layers of 174 and 437 nm thickness is achieved. This can be repeated as many time as desired to achieve a multilayered DBR 35 shown in FIG. 10, but a DBR of two oxide layers (1.5 pairs of silicon and silicon dioxide) has been found to be an advantageous cost/performance compromise. The top layer 34 is typically mechanically polished in producing the final wafer of FIG. 10.

The top silicon layer 34 is implanted or otherwise provided with a n+ arsenic doping to provide an n-type semiconductivity to it. On top of it an epitaxial layer 36 is grown, for example, to a depth of 4,826 nm, FIG. 12, and a top layer 38 is oxidized to a depth of 500 nm, FIG. 13. Because of the silicon expansion upon oxidation, this leaves 5 μm of silicon.

The invention thus shown has advantage in being able to produce uniform and accurate thickness of the burried layers insuring uniformity of performance of different units. The silicon body can also be manufactured as a single crystal layer as can the intervening silicon layers be made single crystal avoiding optical effects at crystal interfaces. The technique provided above also uses silicon fabrication techniques which are well established and understood. The invention also can create thicknesses of widelt varying relative thickness between the insulator and silicon layers. In particular it is desirable for optimal reflectivity to have them of the same optical path length as above. It is thus possible to achieve high efficiency reflectance with a minimum of layers as discussed elsewhere.

Figure 14:
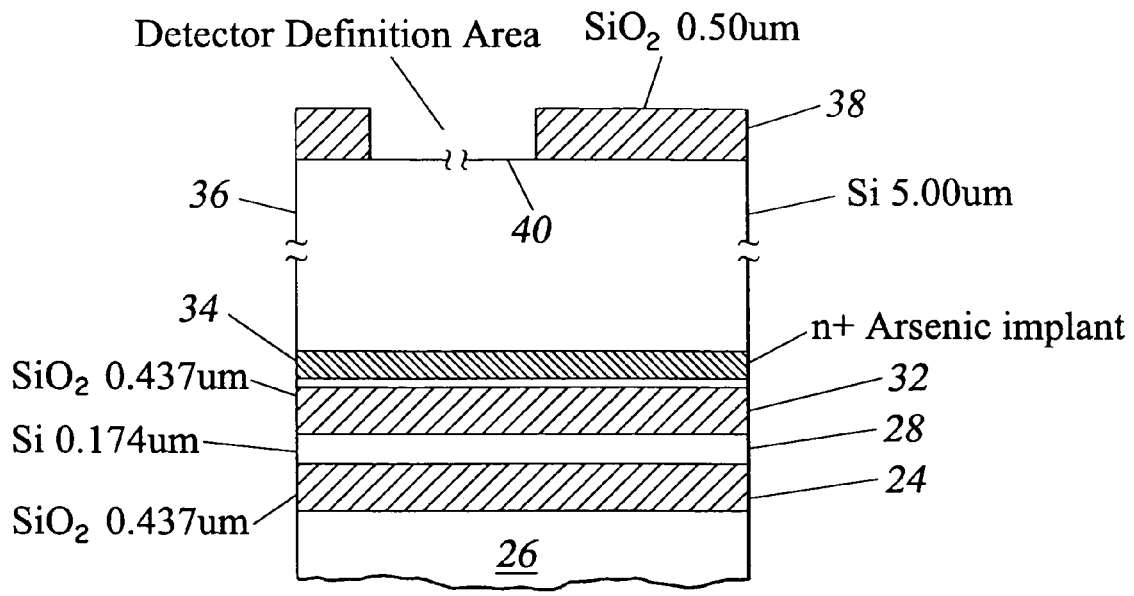
Figure 15:
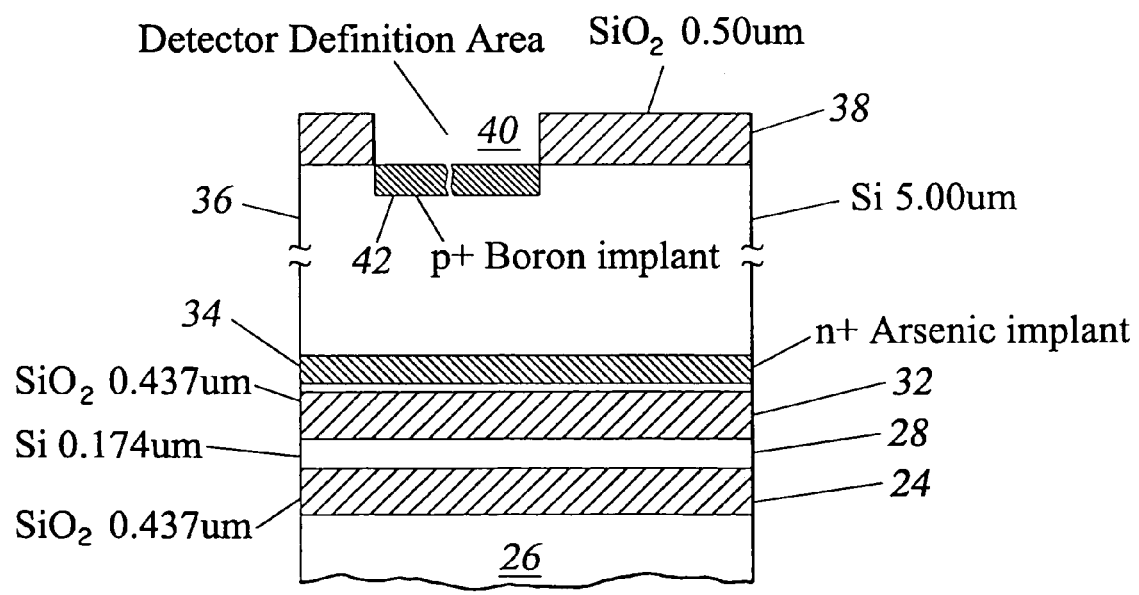

The fabrication of a photodetector using the buried layer of the invention is now illustrated in FIGS. 14-24. Thereafter, and as shown in FIG. 14, the oxide layer 38 is apertured by any well known procedure to expose a surface region 40 of the detector for the admittance of light and a p+ region 42 of dopant created to complete the electrode structure.

Figure 16:
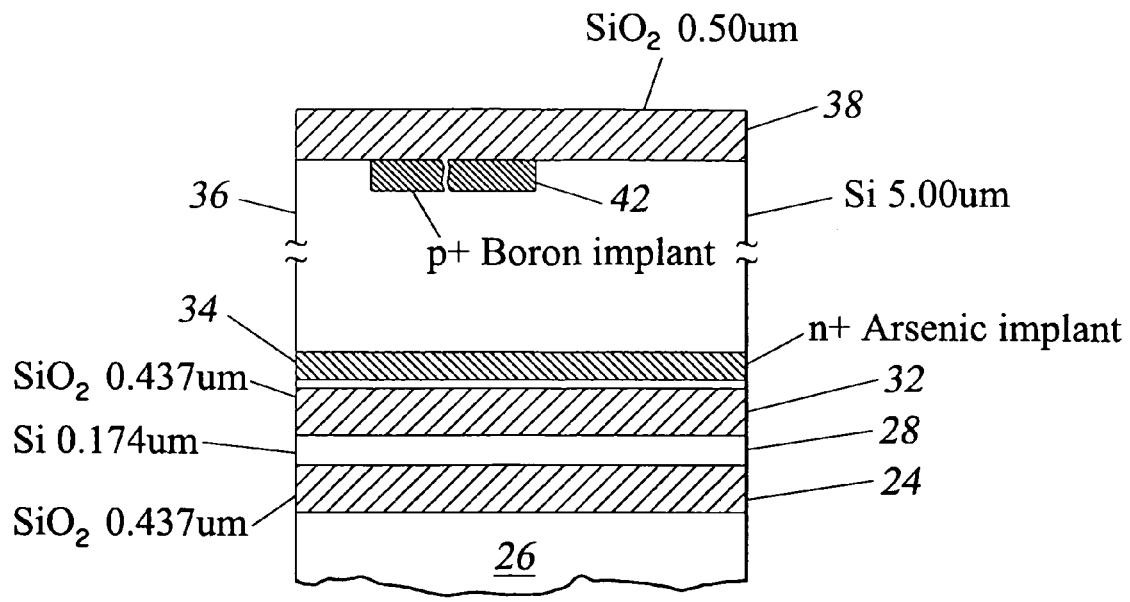
Figure 17:
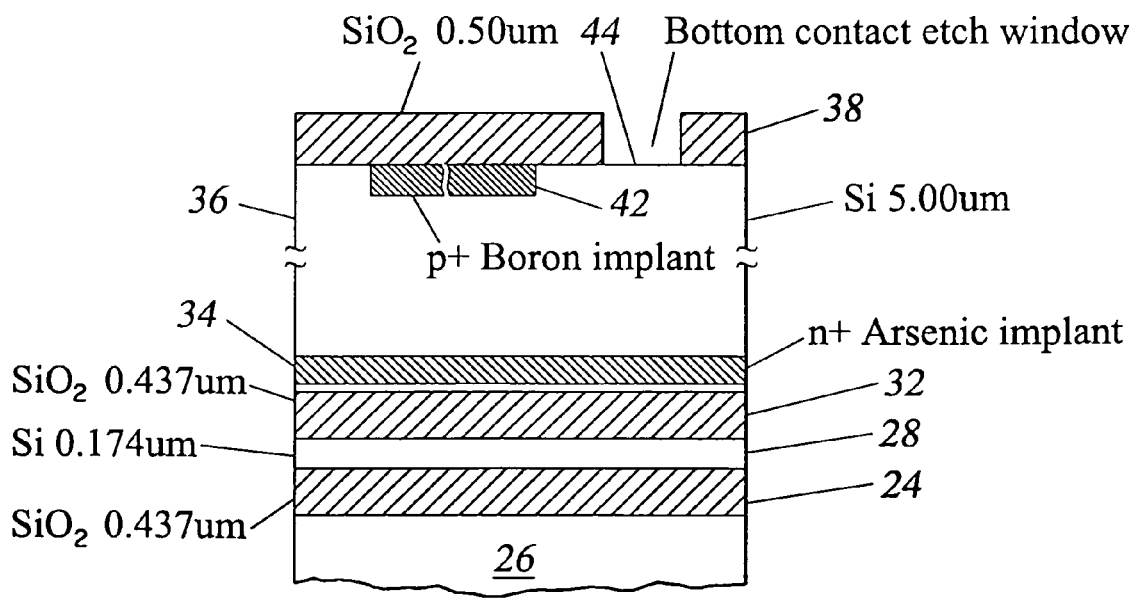
Figure 18:
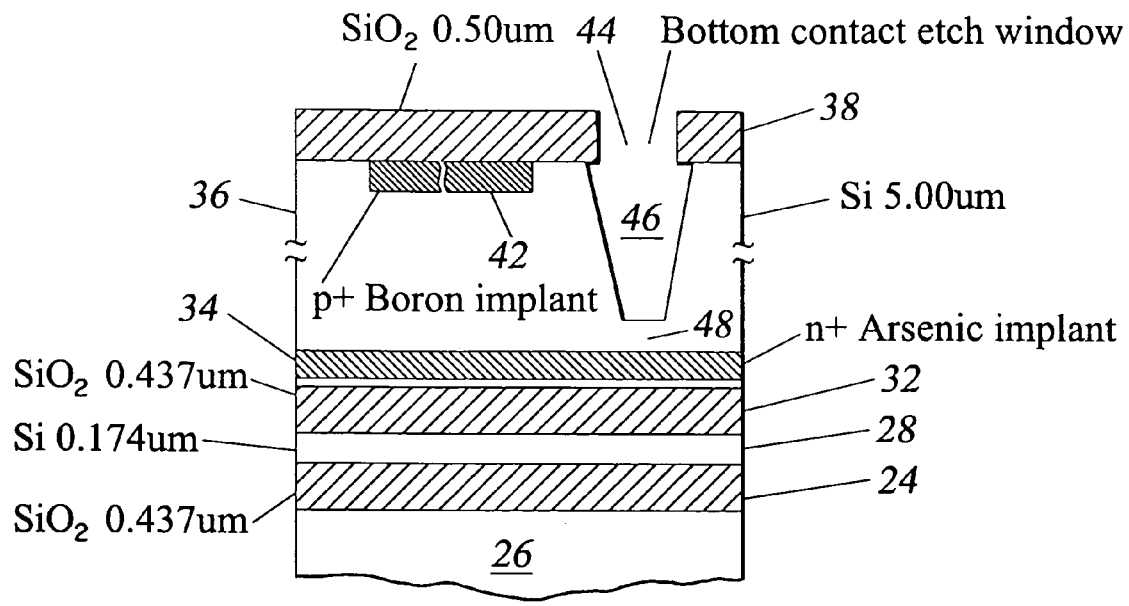
Figure 19:
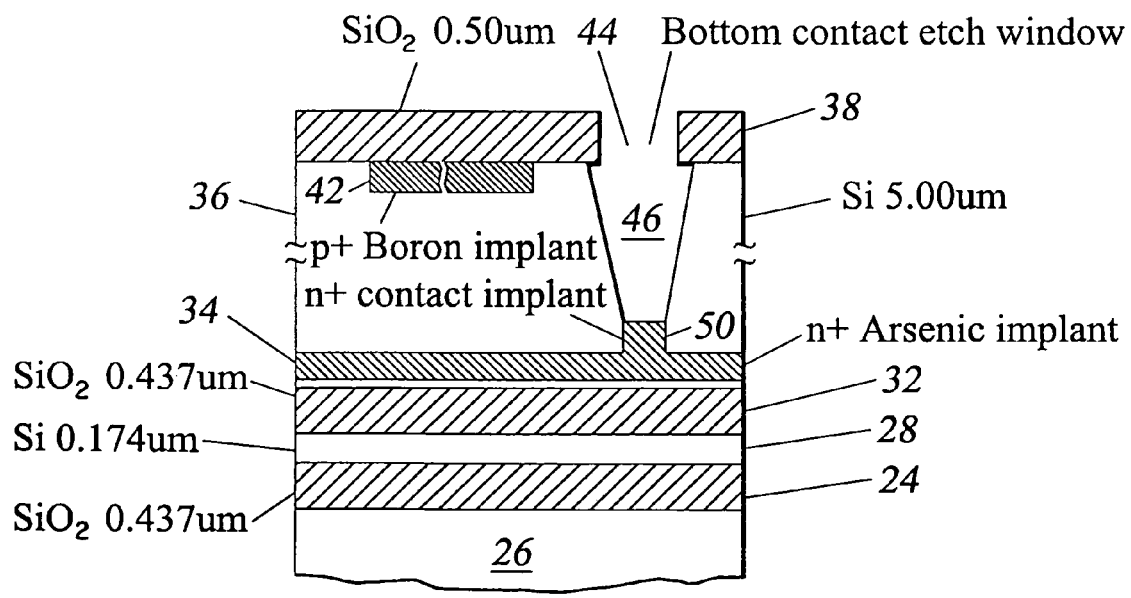
Figure 20:
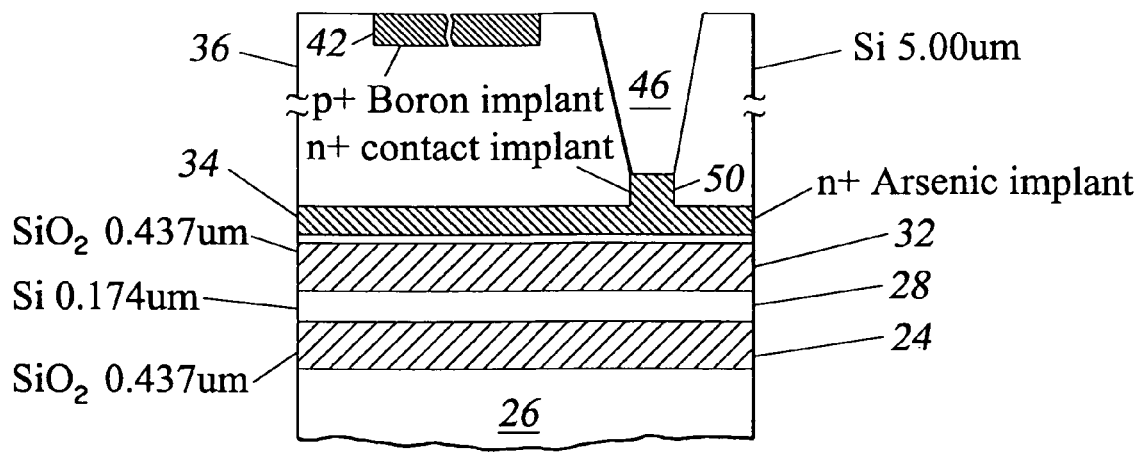
Figure 21:
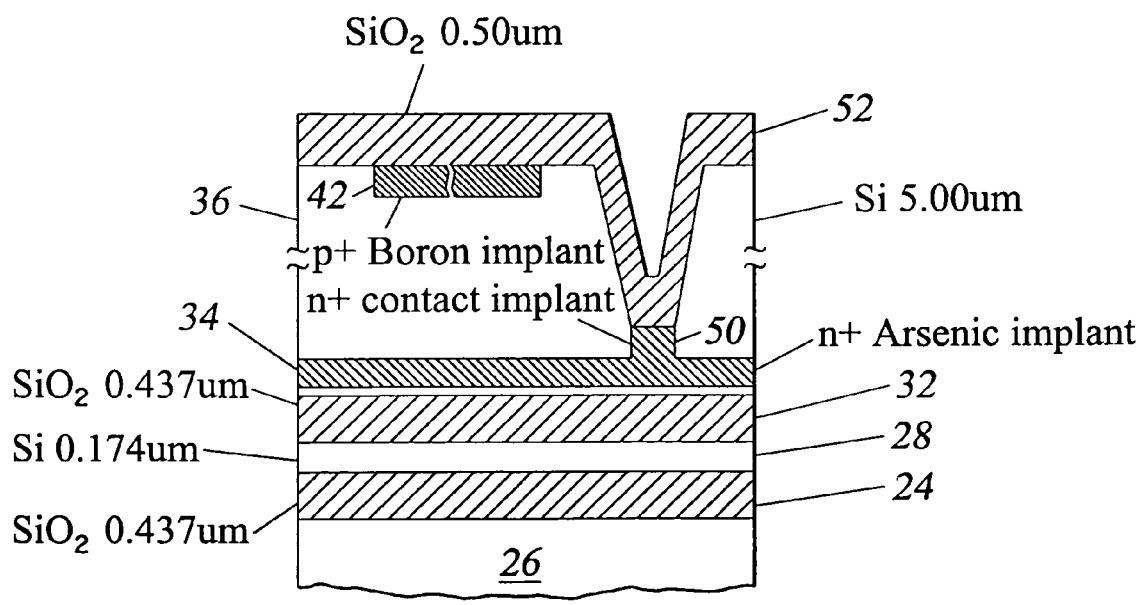
Figure 22:
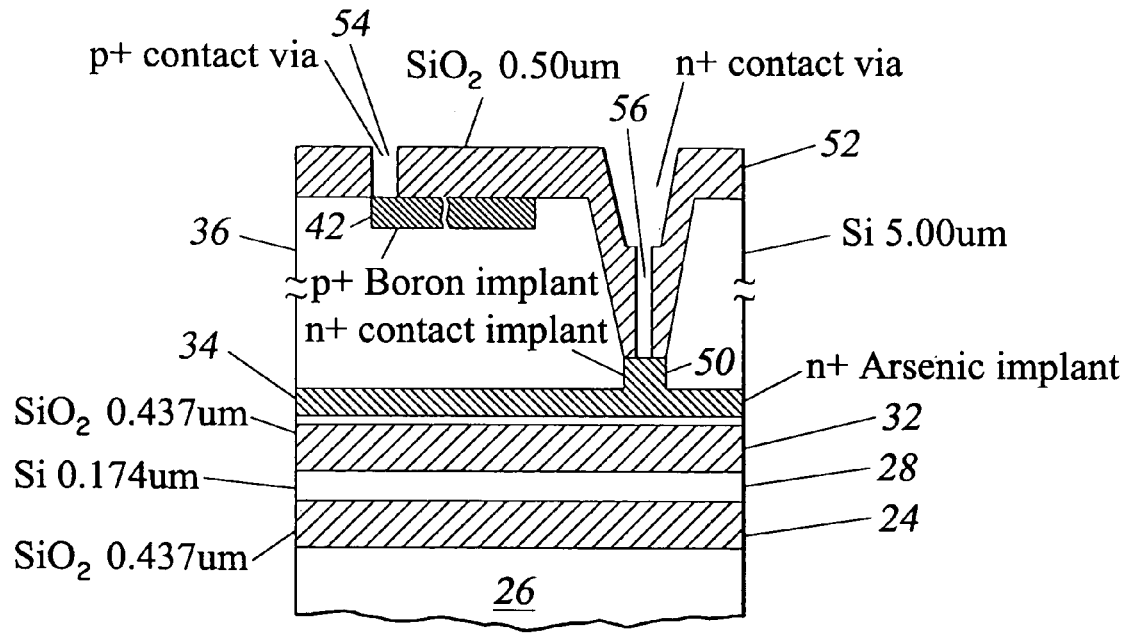
Figure 23:
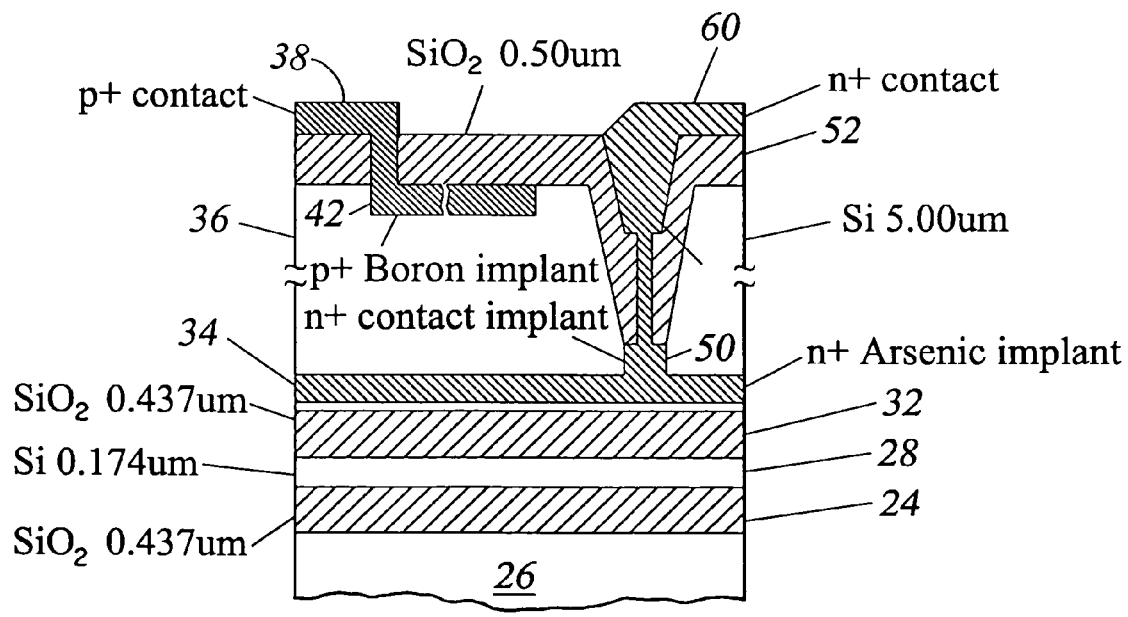
Figure 24:
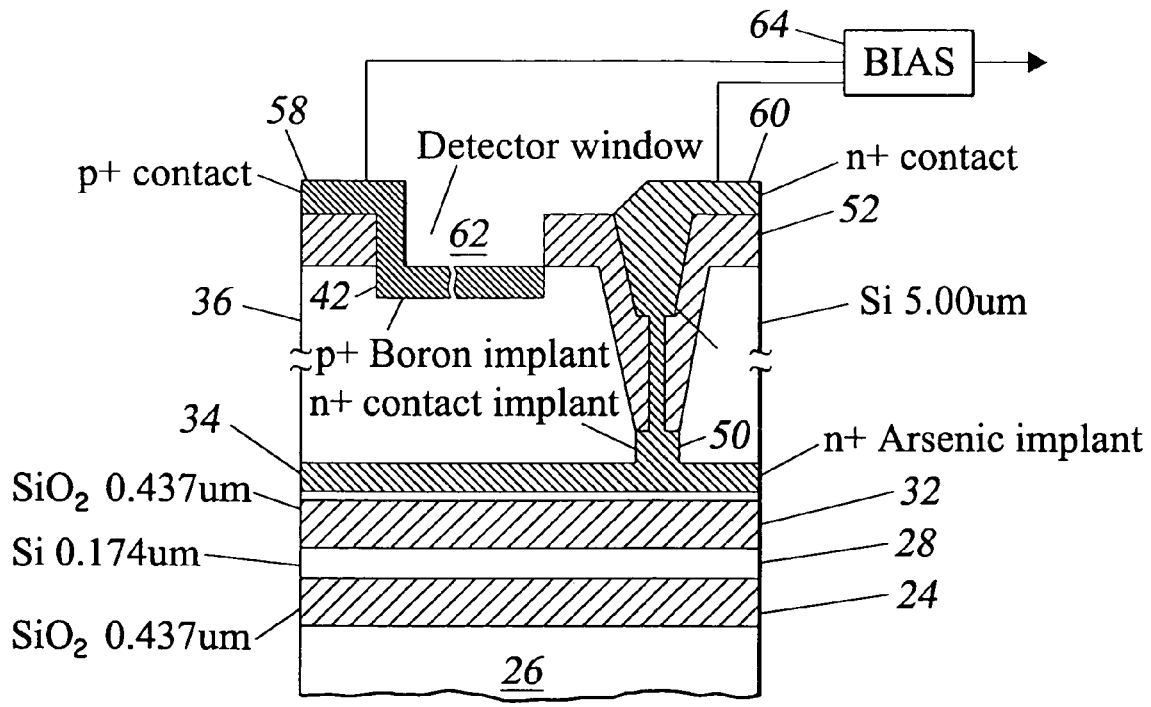

To provide electrical connection to the regions 34 and 42, the oxide layer 38 is regrown across the entire detector, FIG. 16, and a small aperture 44 off to the side of the region 42 opened in it. A deep etch 46 is made to a level 48 just above the n+ layer 34, FIG. 18. An n+ dopant is implanted in the region 50 between the opening 46 and the n+ layer 34, as shown in FIG. 20. Next an entire top layer 52 of oxide is grown or otherwise formed on the surface, FIG. 21, and then etched to open accesses 56 and 54 to the regions 50 and 42 respectively as shown in FIG. 22. Metalizations 60 and 58 are then deposited to provide connection from the regions 50 and 42 to the surface of the oxide layer 52, FIG. 23. Finally as shown in FIG. 24, a light admitting aperture 62 is etched in the oxide layer 52 in the area of region 42 creating an upper reflecting layer and completing the photodetector. A bias source 64 would be provided for operation in light detection, the current drawn thereby being an indication of incident light.

Figure 25:
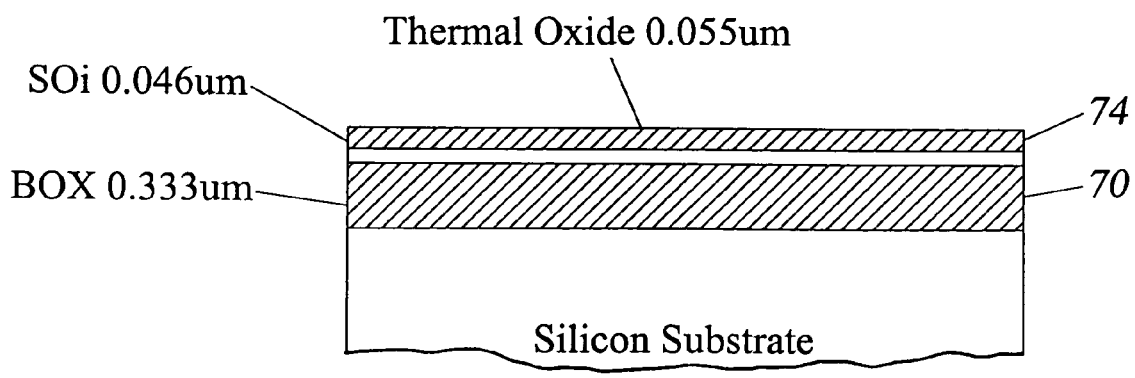
FIGS. 25-31 illustrate an alternative method of forming a buried layer
Figure 26:
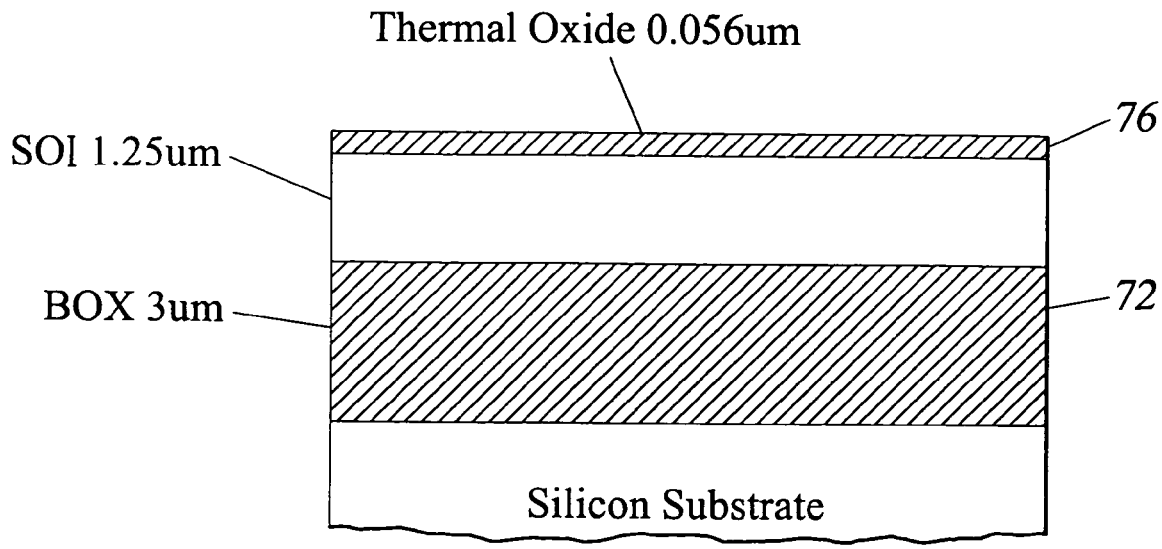
Figure 27:
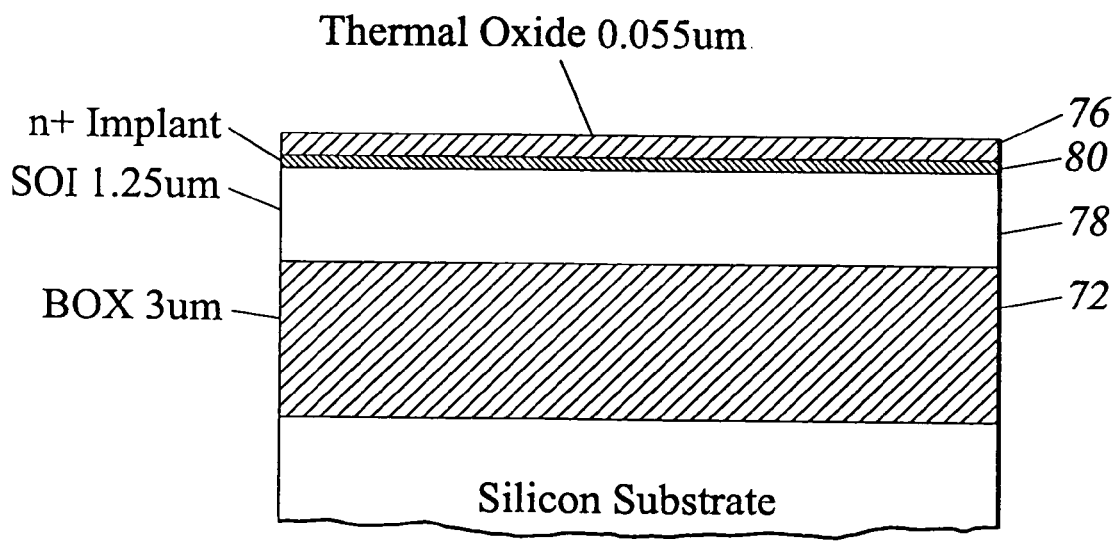
Figure 28:
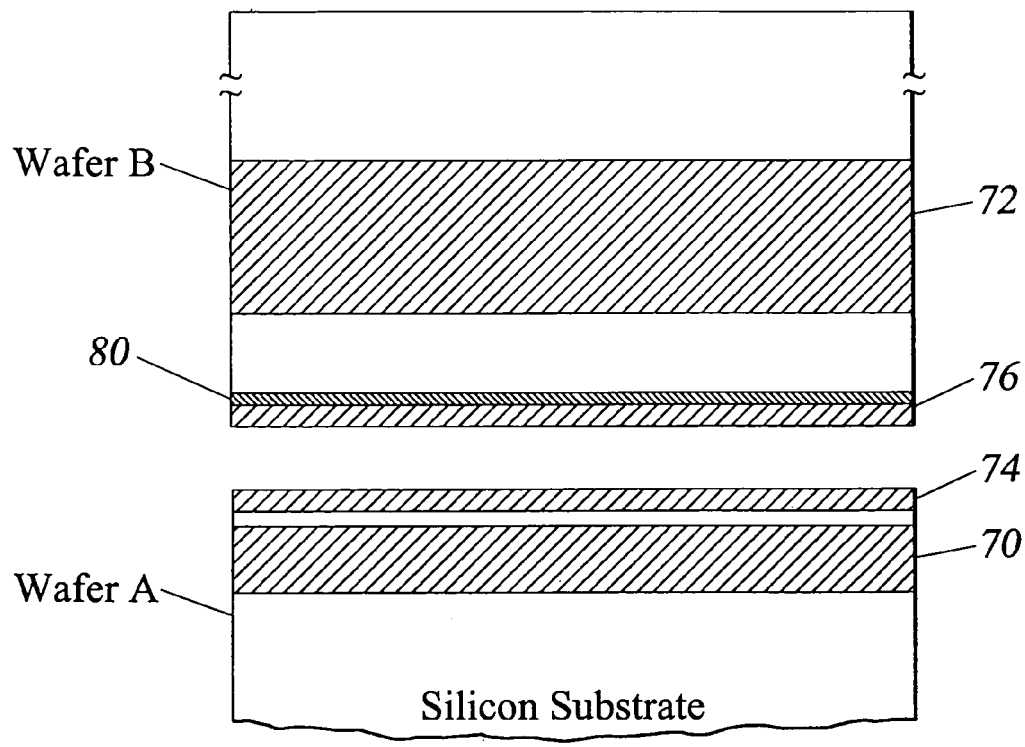
Figure 29:
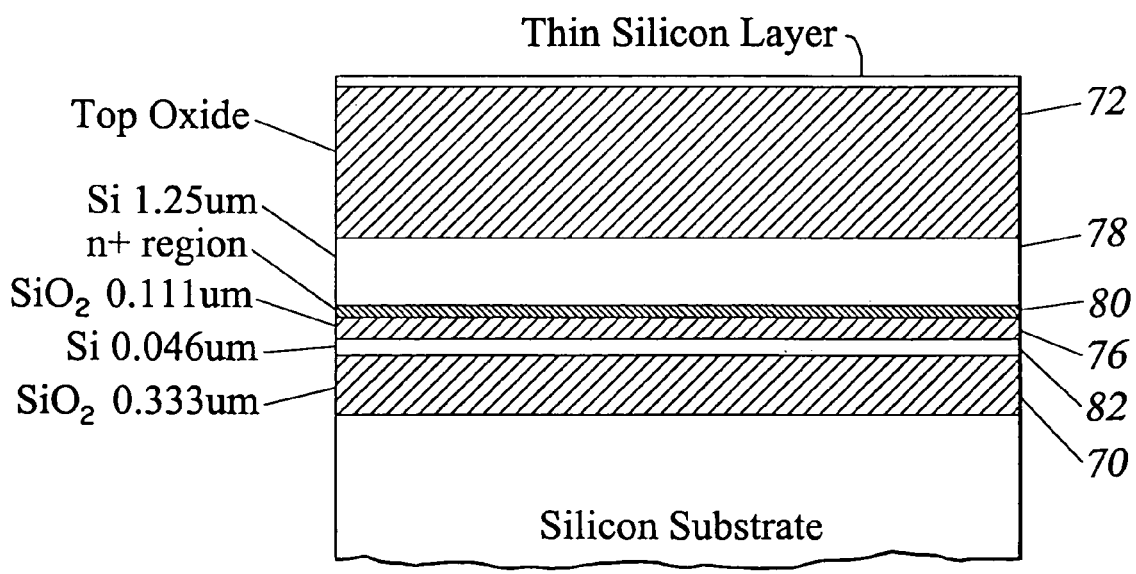
Figure 30:
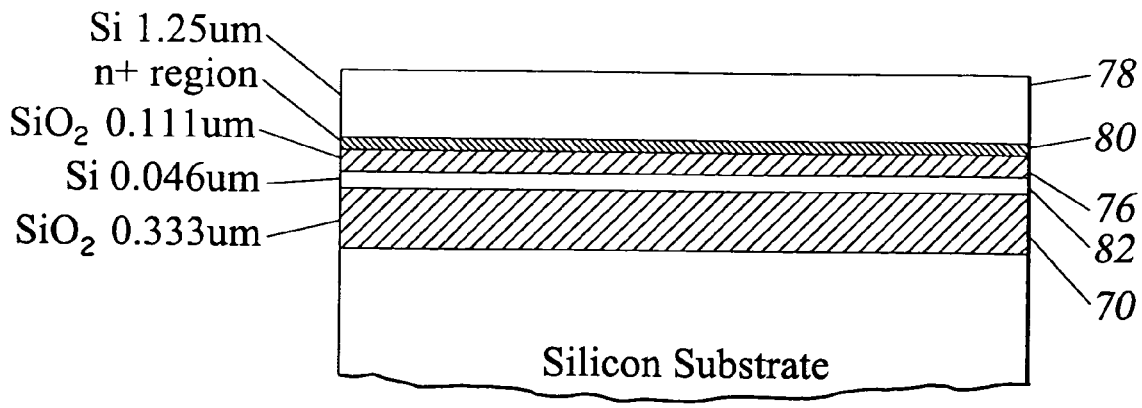
Figure 31:
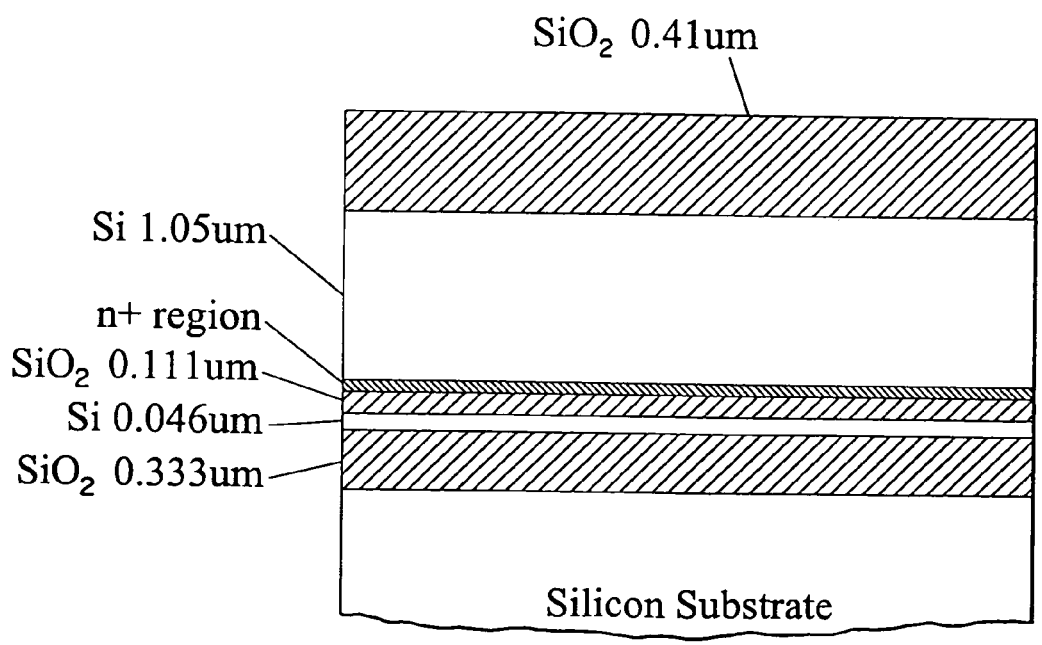

Formation of the DBR layer may alternatively be as shown in FIGS. 25-31. The process begins with first and second wafers as shown in FIGS. 25 and 26. Each has a buried oxide layer, layers 70 and 72 respectively, which is a wafer form generally available in industry. On each, an oxide layer, layers 74 and 76, are formed, all with the exemplary dimensions given for 850 nm sensitivity and selectivity. An n+ dopant is implanted through the layer 76 into a region 80 at an exemplary density of $1\times10^{19}$ cm$^{-3}$ of the underlying silicon region 78, FIG. 27. The surface oxide is then stripped, a new oxide grown as a wet $H_2O$ process at 950 degrees C. for typically ten minutes. The layers 74 and 76 are then brought into contact, FIG. 28, and bonded while being heated to a bonding temperature, FIG. 29. The silicon is mechanically etched as by polishing to leave a thin silicon layer, FIG. 29, which is then removed along with the oxide layer 72 leaving a silicon layer 78 on top of a DBR structure, FIG. 30. A layer 84 of oxide is then created on the silicon layer 78, FIG. 31, and creation of a top layer electrode and metalization connection can proceed as before.

Figure 32:
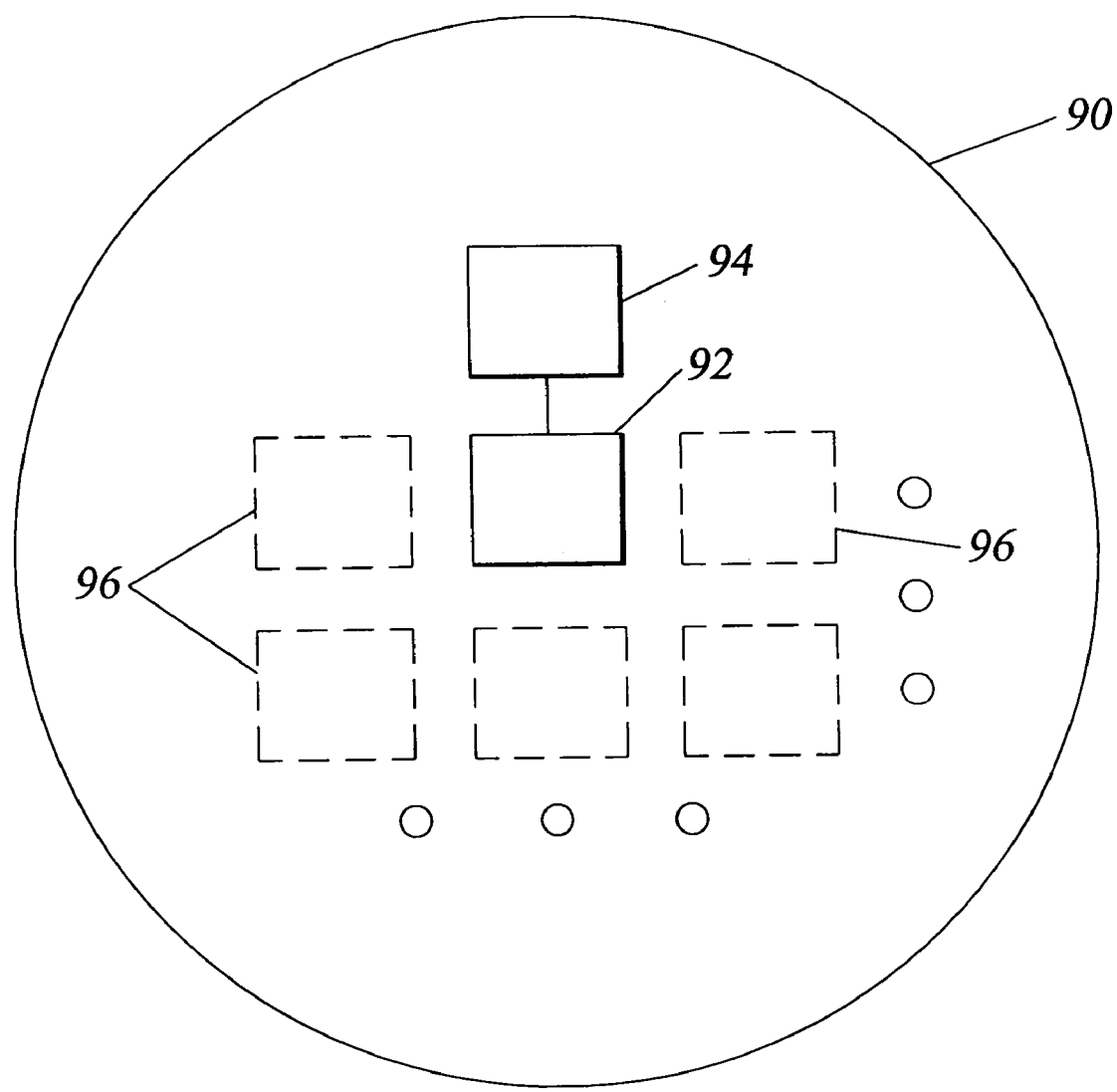
FIG. 32 illustrates the invention used with on-chip electronics and optionally in an array of photodetectors.

In FIG. 32 there is shown a silicon chip having a buried reflector device according to the invention used in a phtotdetector 92. On-chip electronices 94 are provided to process signals from and energize the photodetector 92 for the provision of an output signal reflecting incident light. An array of photodetectors 96 can also be provided in association with the electronics 94 to detect light in two dimensions. The individual photodetectors may have buried layers of different dimensions tailored to respond to different frequencies of light as well.

The various layers described above which are fabricated above the DBR of the invention, or different layers, may be treated with additives of given properties that provide specific frequency characteristics, such as IR sensitivity, to a photodetector thus formed. These layers may include a SiGe absorption region, SiGe/Si quantum well absortpion region, or metal semiconductor internal photoemission (Schottky) type absorption using metal such as Pt, Ir, Pd pr Ni.

It is to be noted that the above described examples use dimensions for wavelengths which are exemplary only and which create no limits on the invention except as claimed.

The invention claimed is:

1. A method for fabricating a silicon photodetector assembly adapted for at least one frequency of light comprising the steps of:

provididing a first body of silicon having a layer of silicon dioxide on a surface thereof;

providing a second body of silicon;

implanting hydrogen atoms at a predetermined depth in said silicon surface forming a boundary between hydrogen implanted silicon and unimplanted silicon;

bonding a silicon surface of said second body to the silicon dioxide layer of the first body;

separating the hydrogen implanted silicon from silicon not hydrogen implanted at said boundary thereby exposing a separated surface;

providing a further body of silicon having a layer of silicon dioxide thereon;

implanting hydrogen atoms at a predetermined depth in said further body forming a boundary between hydrogen implanted silicon and unimplanted silicon;

bonding the silicon dioxide layer of said further body to said exposed silicon surface;

separating the hydrogen implanted silicon from silicon not hydrogen implanted at said boundary of said further body thereby exposing a separated surface thereof;

doping said further body near the separated surface to create a first semiconducting region of one of p and n types;

providing a silicon layer on the separated surface of said further body to form a cavity for light coupled into the silicon layer from a light admitting surface thereof; and doping said silicon layer near the light admitting surface to create a second semiconducting region of type opposite to the type of said first semiconducting region.

2. The method of claim 1 further including the steps of repeating the last mentioned further body providing, implanting, bonding, and separating steps one or more times.

3. The method of claim 1 wherein said bonding step includes the step of heating the hydrogen implanted body to promote cleaving or fracturing at regions containing hydrogen.

4. The method of claim 3 wherein said heating step includes heating to a cleaving temperature followed by heating to a bond strengthening temperature.

5. The method of claim 4 wherein said cleaving temperatures and strengthening temperatures are respectively approximately 600 degrees C. and 1000 degrees C.

6. The method of claim 1 wherein the step of providing a silicon layer includes the step of growing an epitaxial layer on the silicon fractured at said boundary.

7. The method of claim 1 wherein said step of providing a silicon layer includes the step of providing a first semiconducting layer adjacent said boundary.

8. The method of claim 7 wherein said step of providing a silicon layer includes the step of providing a light admitting second semiconductor layer at an outer surface thereof.

9. The method of claim 8 further including the step of providing conducting connections to said each of first and second layers.

10. The method of claim 9 further including the step of biasing said conducting connections.

11. A photodetector assembly manufactured according to the method of claim 1.

12. A method for fabricating a plurality of buried reflective layers comprising alternating layers of silicon and silicon dioxide adapted for at least one frequency of light, comprising the steps of:

providing a first body of silicon having a layer of silicon dioxide on a surface thereof;

providing a second body of silicon;

implanting hydrogen atoms to a predetermined depth in said silicon surface forming a first boundary between hydrogen implanted silicon and unimplanted silicon on either side thereof;

bonding a silicon surface of said second body to the silicon dioxide layer of the first body by heating the hydrogen implanted body to promote bonding and cleaving or fracturing of regions containing hydrogen from regions not containing hydrogen, wherein a first heating step to a cleaving temperature is followed by a second heating step to a bond strengthening temperature;

separating the silicon at the first hydrogen boundary thereby exposing a separated surface;

providing a further body of silicon having a layer of silicon dioxide thereon;

implanting hydrogen atoms to a predetermined depth in said further body forming a second boundary between hydrogen implanted silicon and unimplanted silicon on either side thereof;

bonding the silicon dioxide layer of said further body to said exposed silicon surface to provide alternating layers of silicon and silicon dioxide;

separating the silicon at the second hydrogen boundary thereby exposing a second separated surface; and providing a silicon epitaxial layer on the silicon fractured at said second hydrogen boundary.

13. A method for fabricating a buried reflective layer in silicon of claim 12 wherein said cleaving temperatures and strengthening temperatures are respectively approximately 600 degrees C. and 1000 degrees C.

14. A method for fabricating a buried reflective layer in silicon of claim 12 wherein the step of providing a silicon epitaxial layer on the silicon fractured at said second hydrogen boundary includes first providing an n-type semiconductivity to the silicon fractured at said second hydrogen boundary.

* * * * *

UNITED STATES PATENT AND TRADEMARK OFFICE
CERTIFICATE OF CORRECTION

| | | |
|---|---|---|
| PATENT NO. | : 7,501,303 B2 | |
| APPLICATION NO. | : 10/790403 | |
| DATED | : March 10, 2009 | |
| INVENTOR(S) | : M. Selim Unlu et al. | |

It is certified that error appears in the above-identified patent and that said Letters Patent is hereby corrected as shown below:

Column 2, line 44, "22" should read --24--;

Column 2, line 52, "and thus and thus" should read --and thus--; and

Column 2, line 55, "22" should read --24--.

Signed and Sealed this

Twelfth Day of January, 2010

David J. Kappos
*Director of the United States Patent and Trademark Office*